(12) United States Patent
Sakata

(10) Patent No.: US 7,679,889 B2
(45) Date of Patent: Mar. 16, 2010

(54) DISPLAY APPARATUS

(75) Inventor: Tatsuya Sakata, Tokyo (JP)

(73) Assignee: Sony Corporation, Tokyo (JP)

( * ) Notice: Subject to any disclaimer, the term of this patent is extended or adjusted under 35 U.S.C. 154(b) by 5 days.

(21) Appl. No.: 12/038,335

(22) Filed: Feb. 27, 2008

(65) Prior Publication Data
US 2008/0204987 A1 Aug. 28, 2008

(30) Foreign Application Priority Data
Feb. 28, 2007 (JP) ............................. 2007-050251

(51) Int. Cl.
G06F 1/16 (2006.01)
H05K 5/00 (2006.01)
H05K 7/00 (2006.01)
G02F 1/1333 (2006.01)

(52) U.S. Cl. ............... 361/679.01; 349/58; 361/679.21; 313/582

(58) Field of Classification Search ............ 361/679.21; 313/582; 349/56, 57, 58, 59, 60
See application file for complete search history.

(56) References Cited

U.S. PATENT DOCUMENTS

| 5,570,267 | A  | * | 10/1996 | Ma ........................ 361/679.21 |
| 5,631,756 | A  | * | 5/1997  | Itazawa ........................ 349/58 |
| 6,392,723 | B1 | * | 5/2002  | Sugiyama et al. ............. 349/58 |
| 6,494,429 | B2 | * | 12/2002 | Tajima ................... 361/679.21 |
| 6,507,377 | B1 | * | 1/2003  | Jung ............................ 349/58 |
| 6,560,124 | B1 | * | 5/2003  | Irie et al. ............... 361/679.21 |
| 6,688,576 | B2 | * | 2/2004  | Oishi et al. .............. 315/169.3 |
| 6,826,863 | B1 | * | 12/2004 | Goodfellow ........... 361/679.21 |
| 6,894,739 | B2 | * | 5/2005  | Sung et al. ..................... 349/58 |
| 6,966,617 | B2 | * | 11/2005 | Chen et al. ................... 348/836 |
| 7,170,759 | B2 | * | 1/2007  | Soga ..................... 361/679.21 |
| 7,175,242 | B2 | * | 2/2007  | Lee et al. ..................... 345/905 |
| 7,209,195 | B2 | * | 4/2007  | Lin ............................. 349/58 |
| 7,236,357 | B2 | * | 6/2007  | Chen ..................... 361/679.21 |
| 7,274,559 | B2 | * | 9/2007  | Kim ....................... 361/679.27 |
| 7,463,490 | B2 | * | 12/2008 | Kim et al. ................... 361/752 |
| 2007/0052100 | A1 | * | 3/2007 | Bellinger .................... 257/758 |
| 2007/0242182 | A1 | * | 10/2007 | Hong et al. .................... 349/58 |

FOREIGN PATENT DOCUMENTS

JP 05-103284 4/1993

* cited by examiner

*Primary Examiner*—Jayprakash N Gandhi
*Assistant Examiner*—Adrian S Wilson
(74) *Attorney, Agent, or Firm*—Sonnenschein Nath & Rosenthal LLP

(57) ABSTRACT

A display apparatus includes: a thin plate display device having an image display surface and a back surface; a front cover that covers an outer area and end surfaces of the display surface of the display device; and a back surface cover mounted so as to cover the back surface, the cover being divided into a plurality of parts, wherein a projecting or recessed part is provided at a plurality of places on the front cover facing the end surfaces, a recessed or projecting part is provided that is fit into the projecting or recessed part facing thereto, on the back surface cover, and a slide mechanism part is provided in which the back surface cover is formed to move in parallel along the back surface of the display device and the fitting is achieved by the parallel motion.

5 Claims, 9 Drawing Sheets

DISPLAY APPARATUS

CROSS REFERENCES TO RELATED APPLICATIONS

The present invention contains subject matter related to Japanese Patent Application JP 2007-050251 filed in the Japanese Patent Office on Feb. 28, 2007, the entire contents of which being incorporated herein by reference.

BACKGROUND OF THE INVENTION

1. Field of the Invention

The present invention relates to a display apparatus using a slim display device such as an organic electroluminescent (EL) display, particularly to the configuration of a cabinet assembled as a display apparatus.

2. Description of the Related Art

As a display apparatus having a thin plate display device such as an organic EL display, a plasma display or a liquid crystal display, there is a display apparatus having a front cover that covers the display surface of a display device and a rear cover that covers the opposite side of the display surface (see JP-A-H05-103284 (Patent Reference 1)).

In the display apparatus like this, for example, a rectangular window (opening) is provided on the front cover, and the display surface of the display device is exposed to the front side from the inside of the window.

SUMMARY OF THE INVENTION

In the slim display apparatus like this, it is difficult to form a thin plate display device into an excellent cabinet form that makes use of the slim shape of the display device, as the configuration in which the display device is accommodated in the cabinet for accommodating the display device. In other words, for example, screws are used to fix a front cover to the display device side, which causes a problem that the design is degraded. In the case in which a form is considered that uses no screws to fix a front cover to the display device side, it is necessary to provide a relatively complex mechanism on the front cover side or on the display device side, and it can be assumed as well that the thickness of the front cover, for example, is increased because of the mechanism, which leads to a factor of hampering a reduction in the thickness of the display apparatus.

Particularly, in recent years, a very slim display device, referred to as an organic EL display, is developed and is going into practical use. However, it is difficult to say that the cabinet structure of the display device before is a cabinet form that makes use of the slim form of the display device. In the case of the display apparatus using a slim display device with a plasma display or a liquid crystal display, although it is asserted that the form of the apparatus asserts is slim, the thickness of the cabinet is generally about a few centimeters, and a front cover having some thickness does not cause a big problem so much.

In contrast to this, in the case of the organic EL display, the organic EL display is configured in which a light emitting element formed of light emitting diodes arranged on a thin plate such as glass in a matrix to be a self-luminous display. The organic EL display has the thickness of the display device of a few millimeters, which can more reduce the thickness in an advanced manner than that of the plasma display or the liquid crystal display commercially available as slim display devices before. However, when the cabinet in the configuration before is applied as it is, it is difficult to reduce the thickness of the display apparatus that makes use of the slim form of the display device.

In addition, in conducting assembly work to mount the display device on the cabinet, it is necessary to configure a cabinet in consideration of the assembly workability for allowing assembly at low costs. However, some scheme is necessary to readily assemble a display device configured only of a thin plate such as glass.

It is thus desirable to provide a display apparatus which can be readily assembled and has an excellent form that makes use of the reduction in the thickness of a display device.

An embodiment of the invention is directed to a display apparatus including: a thin plate display device configured to have a display surface displaying an image on one surface and the other surface being a back surface; a front cover configured to cover an outer area and end surfaces of the display surface of the display device; and a back surface cover configured to be mounted so as to cover the back surface of the display device, the cover being divided into a plurality of parts.

Then, a projecting part or a recessed part is provided at a plurality of places on the front cover facing the end surfaces of the display device. In addition, a recessed part or a projecting part is provided that is fit into the projecting part or the recessed part facing thereto, on the back surface cover at a position facing the projecting part or the recessed part on the front cover side.

Moreover, a slide mechanism part is provided in which the back surface cover is formed to move in parallel along the back surface of the display device, whereby the projecting part or the recessed part on the front cover side is fit into the recessed part or the projecting part on the back surface cover to fix the front cover to the display device side by the parallel motion.

As described above, with this configuration, the back surface cover divided into a plurality of parts is mounted on the back surface of the display device, and in this state, the front cover is mounted on the display device on which the back surface covers are mounted. Then, some parts of the back surface cover divided into a plurality of parts are moved in parallel along the back surface of the display device, whereby the front cover is fixed to the display device.

According to the embodiment of the invention, some parts of the back surface cover divided into a plurality of parts are moved in parallel along the back surface of the display device, whereby the front cover is fixed to the display device. Thus, the front cover can be mounted on a slim display device by simple assembly work. In addition, the projecting part or the recessed part that is a mechanism that fixes the front cover on the display device side is provided on the end surface side of the display device, and the sliding direction of the back surface cover is also in the surface direction of the display device. Therefore, the thickness of the cabinet of the display apparatus is not increased due to the provision of the mechanism, and an excellent cabinet form can be provided that makes use of the slim form of the display device. Moreover, the member to slide is the cover on the back surface side, and the projecting part or the recessed part can be concealed as well with the front cover from the front surface side. Thus, in the case in which the display apparatus is seen from the front surface side, the slide mechanism and the projecting part are not seen, and the design as the display apparatus is not impaired.

DETAILED DESCRIPTION OF THE INVENTION

Hereinafter, an example according to an embodiment of the invention will be described with reference to the accompanying drawings.

The example according to the embodiment is adapted to a display apparatus as a television set using a slim display device configured of an organic EL display (electroluminescent display). The organic EL display is a display device that is configured in which light emitting elements are arranged on a thin plate substrate in a matrix. For the display device in the example, such a display device is used that is configured in which light emitting elements are arranged on a glass substrate.

Figure 9:
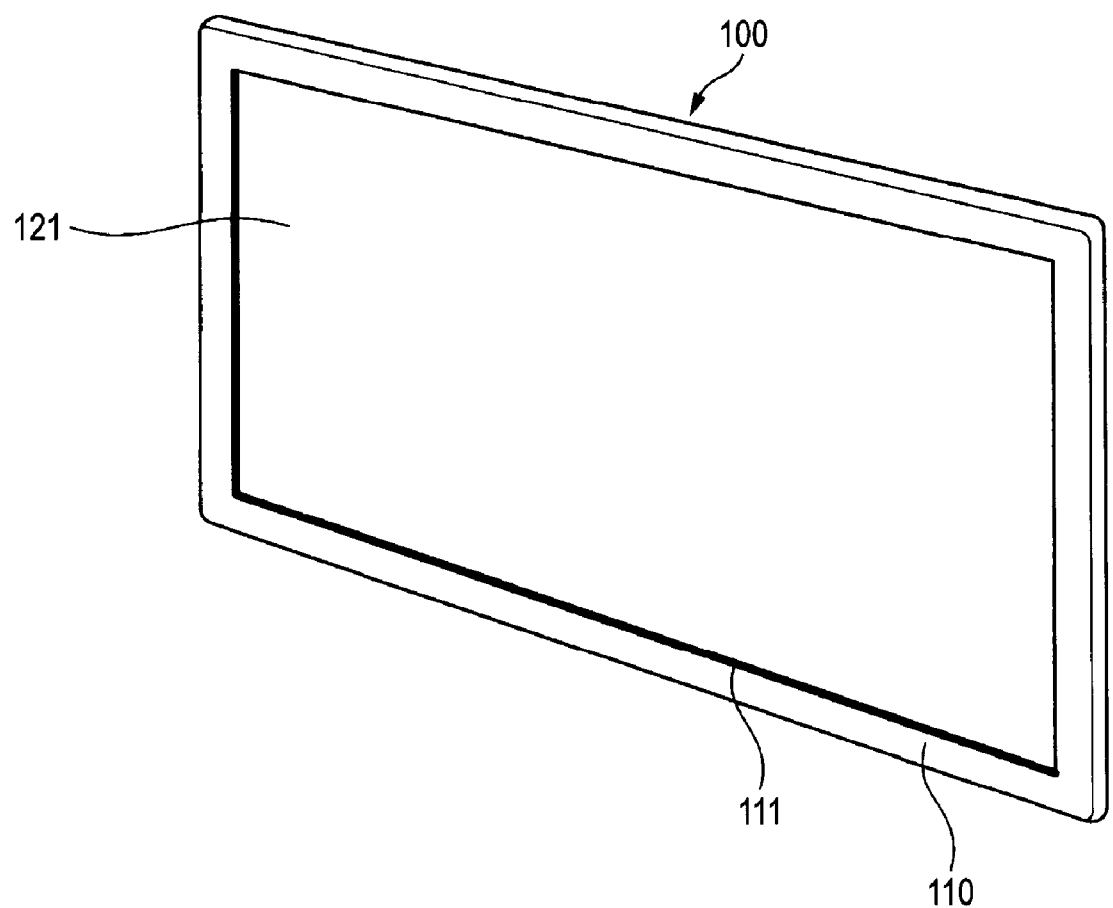
FIG. 9 shows a perspective view depicting the state in which the members are assembled as a display apparatus.

For example, as shown in FIG. 9, a display apparatus 100 according to the example of the embodiment is in the state in which a front surface 121 of a display device is exposed from a window part 111 of a front cover 110 and the exposed front surface 121 is an image display surface.

Figure 1:
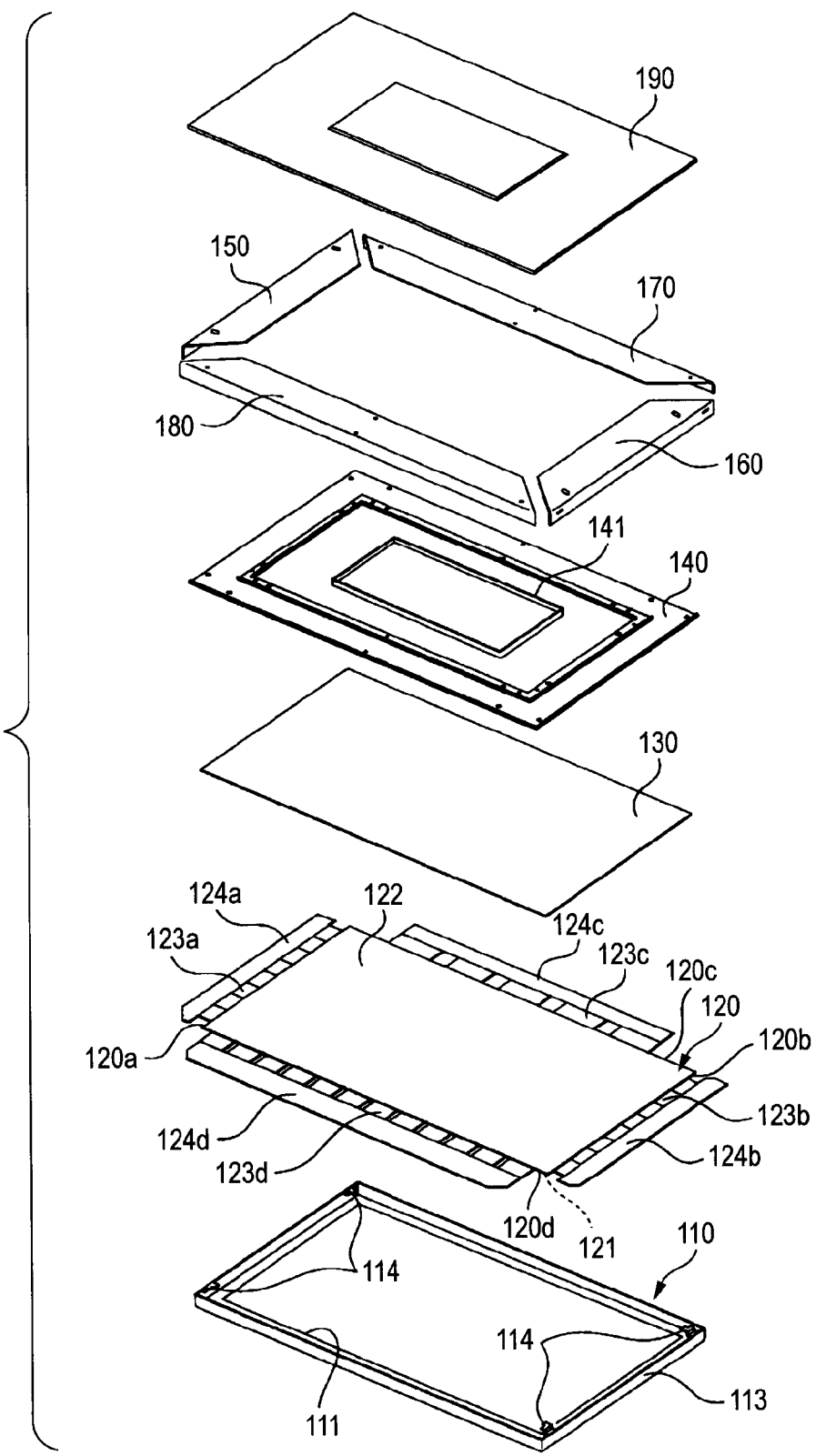
FIG. 1 shows an exploded perspective view depicting an example according to an embodiment of the invention.

FIG. 1 shows an exploded diagram depicting the display apparatus 100 according to the example of the embodiment. In FIG. 1, the lower side is the front surface side on which an image is displayed, and the upper side is the back surface side on the opposite side of the surface on which an image is displayed. In the discussion below, in the case of describing the front surface or the back surface, the surfaces are referred to as the front surface or the back surface of a display apparatus.

The members will be described in order from the front surface side. For example, a front cover 110 is formed of a metal sheet by press working, in which a window part 111 is formed that covers the outer area of a front surface 121 of the display device 120, and a side plate part 113 is formed throughout the outer area of the window part 111 so as to cover the end surface of the display device 120. Inside the side plate part 113, a fitting 114 is fixed at two places on the upper part and the lower part of the right and left side surfaces (four places in total). The fitting 114 is a projecting member having a projecting part 114a (FIG. 7) that has the tip end projecting inward in a predetermined width.

The display device 120 is configured on a glass substrate in which the front surface 121 is a video display surface. In FIG. 1, a back surface 122 is seen. On right and left end surfaces 120a and 120b and upper and lower end surfaces 120c and 120d of the display device 120, one ends of flexible substrates 123a, 123b, 123c and 123d are mounted, respectively. On the other ends of the flexible substrates 123a, 123b, 123c and 123d, rigid substrates 124a, 124b, 124c and 124d are mounted, respectively. The rigid substrates 124a, 124b, 124c and 124d are connected to a circuit board of the display device, not shown. The members are thus connected, whereby drive signals of the display outputted from the circuit board side on which video signals are processed are supplied to the display device 120 to show video on the display device 120.

In assembling the display device, a thermal conductive sheet 130 and a reinforcing plate 140, described later, are placed on the back surface 122, and the flexible substrates 123a, 123b, 123c and 123d extended from the four end surfaces 120a, 120, 120c and 120d are bent to the back surface 122 of the display device 120.

On the back surface 122 of the display device 120, the thermal conductive sheet 130 is placed. The thermal conductive sheet is a sheet that releases the heat of the display device 120 to around thereof.

On the back surface side of the thermal conductive sheet 130, therein forcing plate 140 is placed. Therein forcing plate 140 is a metal plate in almost the same size as the display device 120, having an opening 141 in the center part. Around the reinforcing plate 140, a plurality of screw holes are provided, and substrate covers 150 to 180, described below, are fixed to the reinforcing plate 140 by screwing to the screw holes. In the opening 141 in the center part, a circuit board is arranged on which a circuit for video display process is placed.

On the back surface side of the reinforcing plate 140, the substrate covers 150 to 180 are mounted. The substrate covers according to the example are configured of four substrate covers 150, 160, 170 and 180. The substrate cover 150 is mounted so as to cover the display device 120 from the left end surface 120a to the back surface. The substrate cover 160 is mounted so as to cover the display device 120 from the right end surface 120b to the back surface. The substrate cover 170 is mounted so as to cover the display device 120 from the upper end surface 120c to the back surface. The substrate cover 180 is mounted so as to cover the display device 120 from the lower end surface 120d to the back surface. The place at which one substrate cover is contacted with the other substrate cover is formed into a shape cut at an angle of about 45 degrees. The substrate covers function as a cover that shields the flexible substrates 123a to 123d and the rigid substrates 124a to 124d.

The left and right substrate covers 150 and 160 are provided with a fixing mechanism that is fit into the fitting 114 on the front cover 110 side. The detail of the fixing mechanism will be described later.

Then, in the state in which the four substrate covers 150, 160, 170 and 180 are mounted on the display device 120 side, a rear cover 190 is fixed to the back surface side. The rear cover 190 is a member formed to cover the entire back surface of the display apparatus 100, which is configured of a metal plate, for example.

Next, the process steps of assembling the members to complete the display apparatus shown in FIG. 9 will be described.

Figure 2:
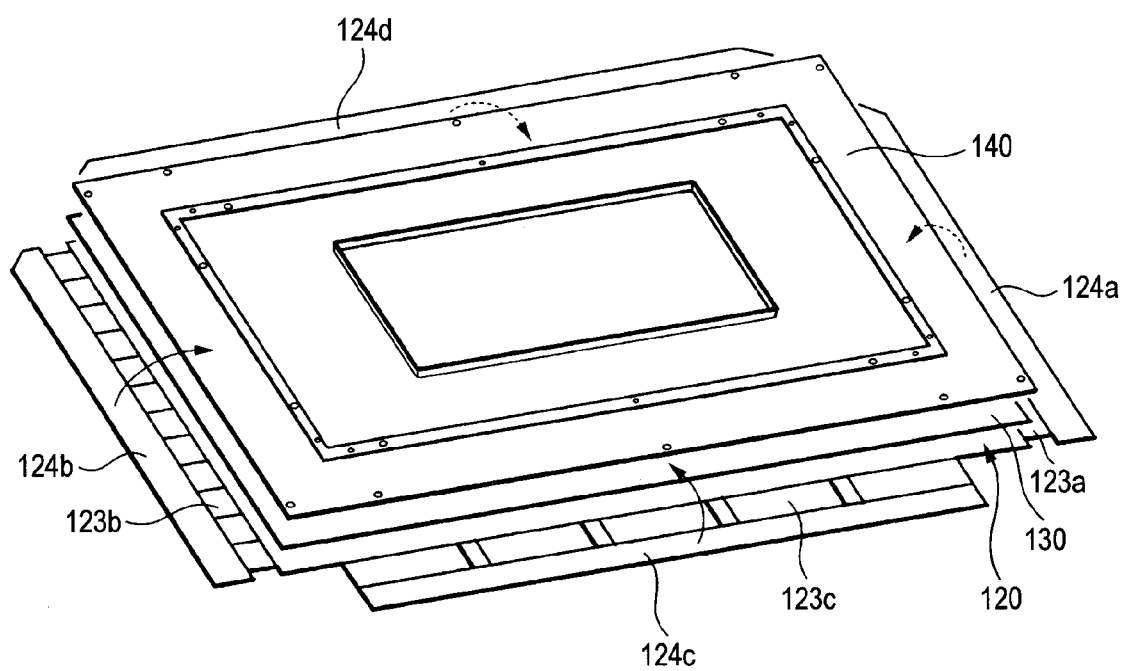
FIG. 2 shows an exploded perspective view depicting the display device shown in the example of FIG. 1 and the peripherals thereof.

First, with reference to FIG. 2, the members directly mounted on the display device 120 will be described. As shown in FIG. 2, in the display device 120 configured of a glass plate on which light emitting elements and wiring electrodes are arranged, the flexible substrates 123a, 123b, 123c and 123d and the rigid substrates 124a, 124b, 124c and 124d are separately mounted on four end surfaces, and are extended in four directions. The back surface 122 of the display device 120 is placed upward, the thermal conductive sheet 130 and the reinforcing plate 140 are layered thereon, and then the flexible substrates 123a, 123b, 123c and 123d are bent to the back surface side.

Figure 3:
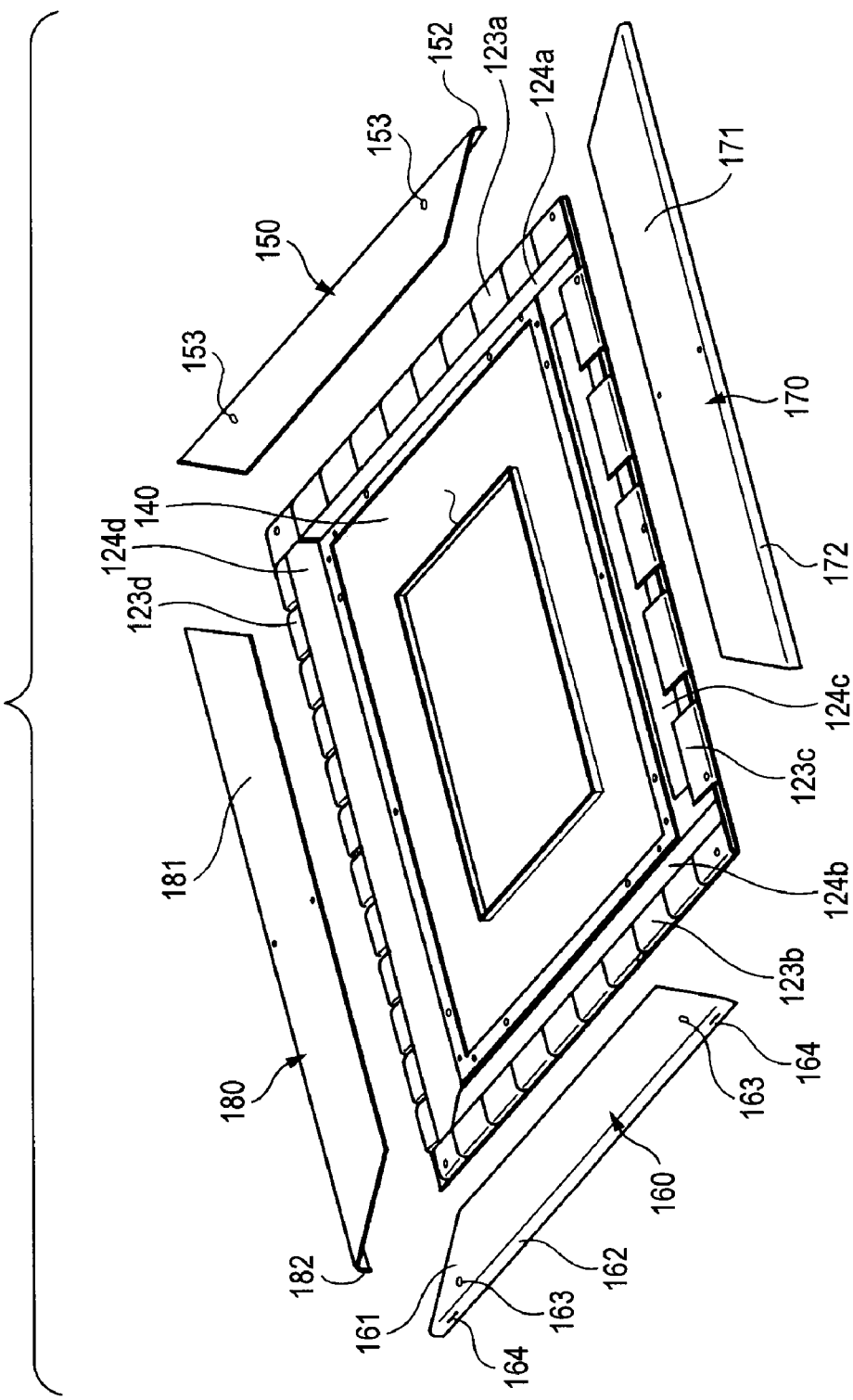
FIG. 3 shows an exploded perspective view depicting the state in which a cover is mounted on the assembled members of the example shown in FIG. 2.

As described above, the flexible substrates 123a, 123b, 123c and 123d are bent to the back surface side, whereby as shown in FIG. 3, the display device 120, the thermal conductive sheet 130 and the reinforcing plate 140 are assembled in one piece. For fixing the display device 120 to the thermal conductive sheet 130 and fixing the thermal conductive sheet 130 to the reinforcing plate 140, for example, a pressure sensitive adhesive is used. For the fixing state using the pressure sensitive adhesive, a pressure sensitive adhesive double coated tape (pressure sensitive adhesive double coated sheet) is used for fixing. Alternatively, the thermal conductive sheet 130 itself is formed as a sheet having the adhesion properties to bond the display device 120 to the reinforcing plate 140 with the adhesion properties of the thermal conductive sheet 130 as the thermal conductive sheet 130 is sandwiched therebetween. Moreover, in the state shown in FIG. 2, the display device 120, the thermal conductive sheet 130 and the reinforcing plate 140 are formed in almost the same size. However, for example, such a scheme may be possible in which the thermal conductive sheet 130 is formed slightly smaller than the display device 120, the thermal conductive sheet 130 is placed in the center of the back side of the display device 120, and in this state, the outer area of the back side of the display device 120 is directly bonded to the reinforcing plate 140 with a pressure sensitive adhesive double coated tape. In addition, instead of the pressure sensitive adhesive, an adhesive may be used for fixing.

Then, as shown in FIG. 3, the substrate covers 150 to 180 are separately mounted on each of the end surfaces at the positions from the four end surfaces to the back surface of the display device 120 on which the reinforcing plate 140 and the other members are mounted in one piece as discussed above. In other words, the individual substrate covers 150, 160, 170 and 180 have a form of back plate parts 151, 161, 171 and 181 and side plate parts 152, 162, 172 and 182 separate from each other, in which the side plate parts 152, 162, 172 and 182 are brought close to the end surfaces of the display device 120 and the back plate parts 151, 161, 171 and 181 are overlaid over the back surface of therein forcing plate 140 for assembly.

The substrate covers 150 to 180 are mounted on the reinforcing plate 140 by screwing with the use of screw holes provided on the substrate covers 150 to 180 and the reinforcing plate 140. In the fixed state, it is configured in which the flexible substrates 123a to 123d and the rigid substrates 124a to 124d bent on the back surface side are covered and concealed with the substrate covers 150 to 180.

Among the four substrate covers 150 to 180, the two substrate covers 170 and 180 positioned at the upper part and the lower part of the back surface of the display device 120 are configured to completely decide their positions by screwing. In contrast to this, the two substrate covers 150 and 160 positioned at the left side and the right side of the back surface of the display device 120 are configured to be mounted on the back surface of the reinforcing plate 140 in the state in which the substrate covers 150 and 160 are slightly movable in the left and right directions. In other words, for the substrate covers 150 and 160, long screw holes 153 and 163 are provided as mounting screw holes that are extended about a few millimeters in the right and left directions, and the substrate covers 150 and 160 can be moved a few millimeters in the left and right directions as corresponding to the long screw holes 153 and 163. However, in the state in which the screws fit into the long screw holes 153 and 163 are fastened and fixed to the reinforcing plate 140, the positions of the substrate covers 150 and 160 are fixed to therein forcing plate 140. In addition, in the state in which the display device 120 is not mounted on the front cover 110, the substrate covers 150 and 160 are fixed at the positions most pulled back to the display device 120 side.

Figure 6:
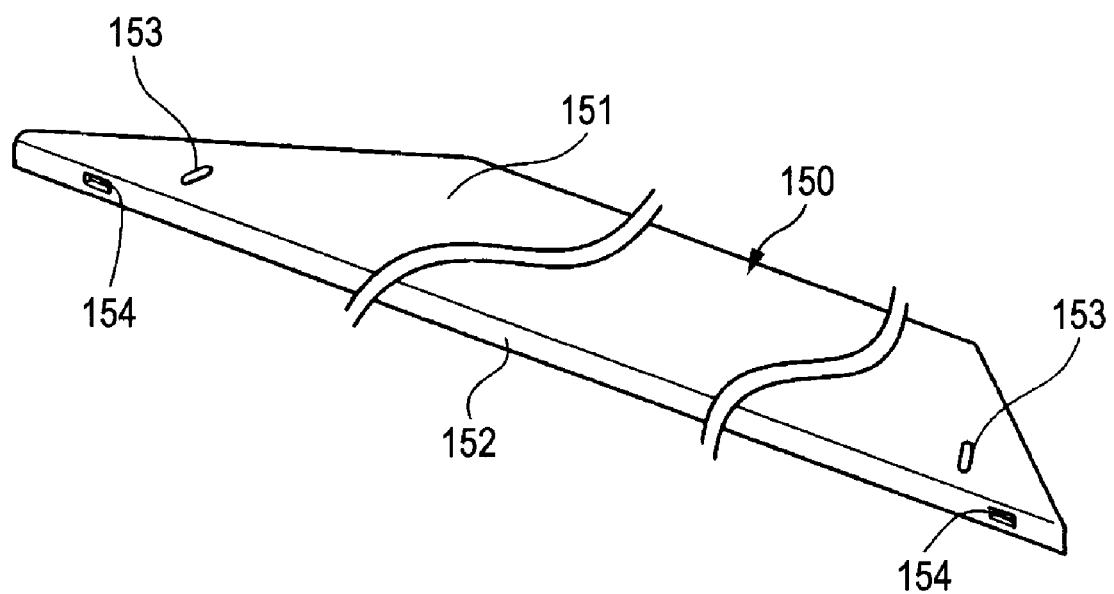
FIG. 6 shows a perspective view depicting the front surface side of the substrate cover.

The two substrate covers 150 and 160 have slits 154 and 164 at two placed on the side plate parts 152 and 162 spaced at a predetermined interval (for the slit 154, see FIG. 6). The interval of arrangement of the slits 154 and 164 is the same interval of arrangement of the fittings 114 on the front cover 110 side (see FIG. 1, for example). The detail of fixing the substrate covers 150 and 160 will be described later.

Figure 4:
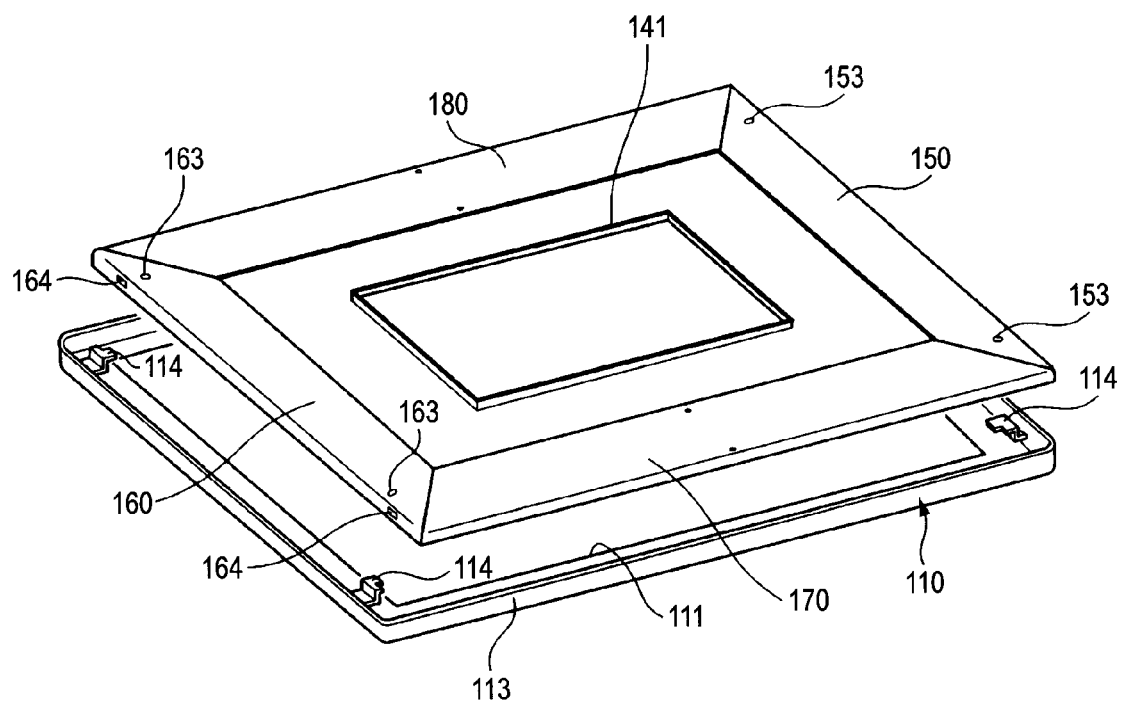
FIG. 4 shows an exploded perspective view depicting the state in which a front cover is mounted on the members mounted with the cover shown in the example of FIG. 3.

Then, as shown in FIG. 4, the front cover 110 is overlaid and mounted on the front surface side of the display device 120 on which the four substrate covers 150 to 180 are mounted. As shown in FIG. 4, the front cover 110 is overlaid to position the fittings 114 arranged at four places inside the side plate part 113 of the front cover 110 so that the fittings 114 face the two slits 154 of the substrate cover 150 and the two slits 164 of the substrate cover 160. In this state, the substrate covers 150 and 160 are slid along the long screw holes 153 and 163, and the projecting parts 114a at the tip end of the fitting 114 are fit into the slits 154 and 164 of the recessed parts on the substrate covers 150 and 160 for fixing the front cover 110.

Figure 5:
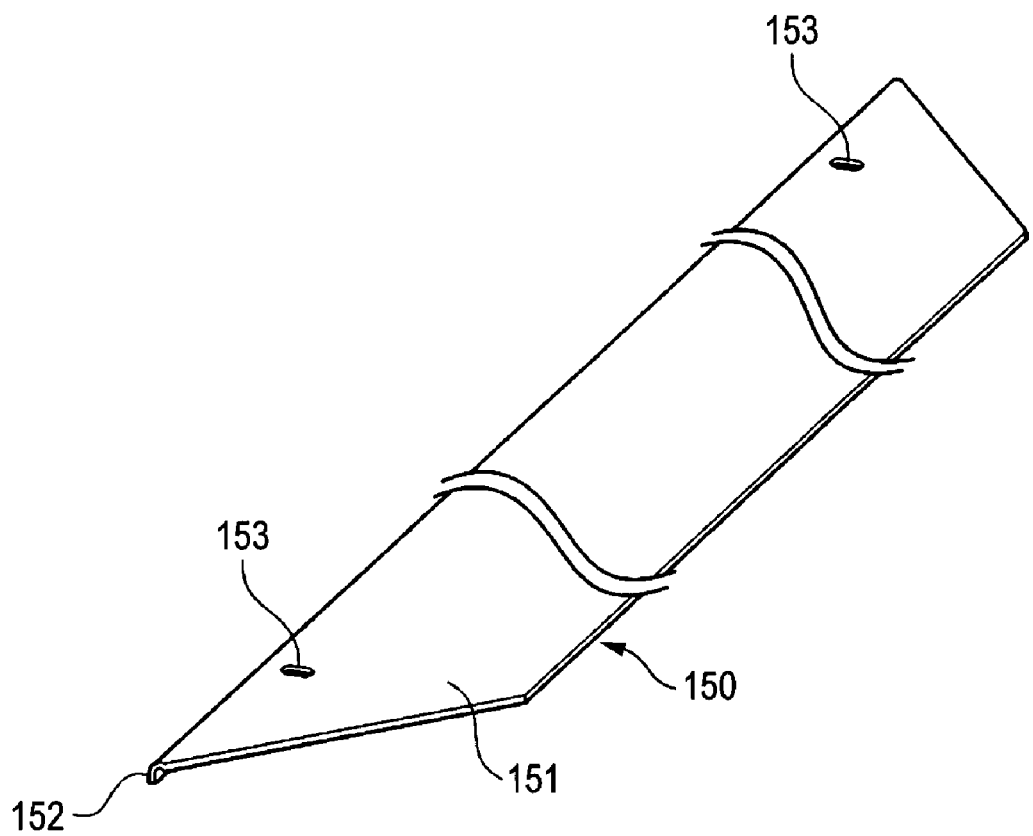
FIG. 5 shows a perspective view depicting the back surface side of a substrate cover.

FIGS. 5 and 6 show a diagram depicting an exemplary configuration of the substrate cover 150. The substrate cover 160 arranged at the symmetrical position to the substrate cover 150 has the same form as the substrate cover 150 shown in FIGS. 5 and 6.

Figure 7:
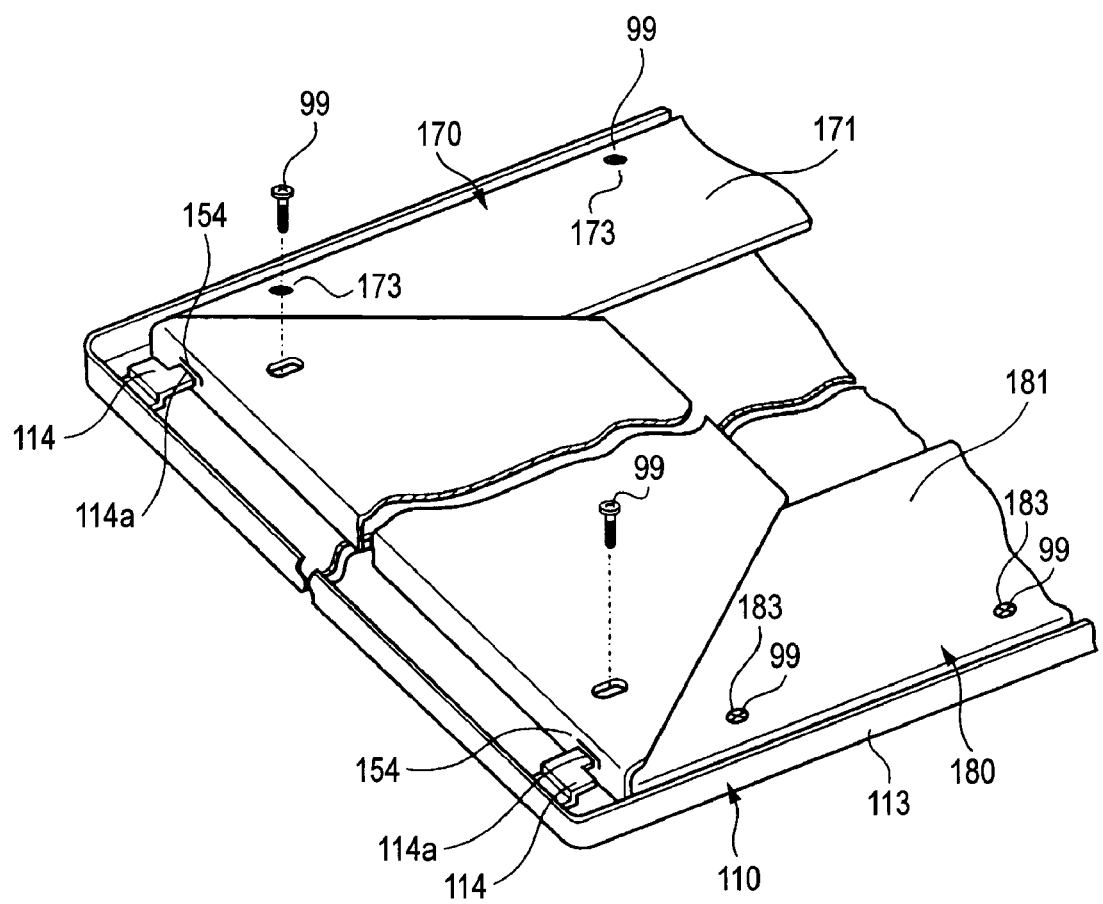
FIG. 7 shows a partially cutaway perspective view depicting an exemplary configuration of a mounting part of the front cover and the substrate cover.
Figure 8:
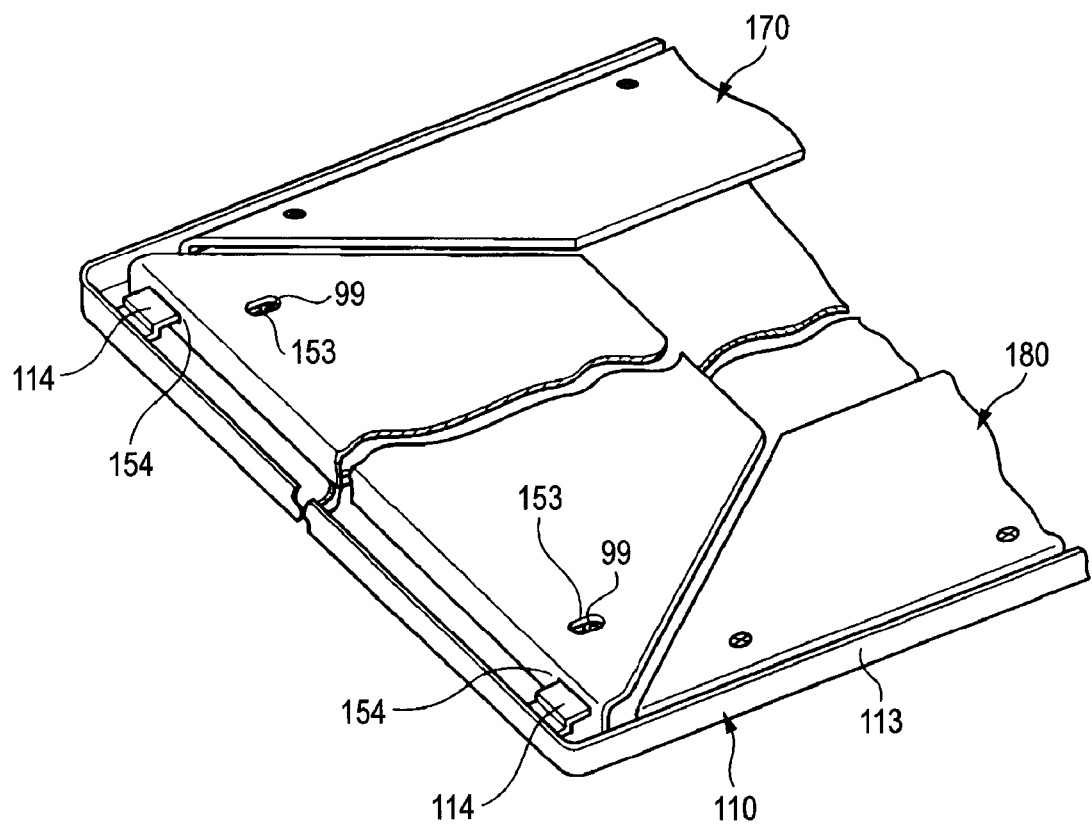
FIG. 8 shows a partially cutaway perspective view depicting the state in which the substrate cover is slid and mounted on the front cover in the example shown in FIG. 7.

As shown in FIG. 5, on the back plate part 151 of the substrate cover 150, the two long screw holes 153 are arranged in parallel with each other at a predetermined interval. In addition, as shown in FIG. 6, on the side plate part 152 of the substrate cover 150, the two slits 154 are arranged at a predetermined interval. The long screw hole 153 is a screw hole into which a screw 99, described later, is mounted (FIGS. 7 and 8). The slit 154 is a rectangular through hole that functions as a recessed part into which the projecting part 114a at the tip end of the fitting 114 on the front cover 110 side is fit.

FIGS. 7 and 8 show an exploded, enlarged diagram partially depicting the state in which the front cover 110 is fixed to the display device 120 mounted with the substrate cover 150 thus configured.

In FIG. 7, the screws 99 for screwing the substrate cover 150 to the reinforcing plate 140 are inserted into the long screw holes 153, and the screws 99 are screwed and fixed to the reinforcing plate 140, not shown. At this time, the substrate cover 150 that is slidable by the length of the long screw hole 153 is fixed at the position most pulled back from the end surface of the display device 120. The substrate cover 160 not shown in FIG. 7 is similarly fixed. However, the screws 99 for fixing the two substrate covers 150 and 160 are loosened more or less in mounting the front cover 110 to allow the substrate covers 150 and 160 to be slidable.

As shown in FIG. 7, the substrate covers 170 and 180 in vertical the direction are also screwed to the reinforcing plate 140 with the screws 99. The positions of the substrate covers 170 and 180 are decided by screwing, and the substrate covers 170 and 180 are not slid.

Then, as shown in FIG. 7, the projecting parts 114a of the fittings 114 of the front cover 110 are arranged so as to face the slits 154 and 164 of the substrate covers 150 and 160 (in FIG. 7, the members on the substrate cover 160 side are not shown), and then the substrate covers 150 and 160 are slid so as to project outward. The substrate covers 150 and 160 are slid as described above, and then as shown in FIG. 8, the projecting parts 114a of the fittings 114 are fit into the slits 154 and 164. In this state, the screws 99 inserted into the long screw holes 153 and 163 are fastened to fix the positions of the substrate covers 150 and 160.

As described above, the substrate covers 150 and 160 are slid to mount the front cover 110 on the display device 120 side, and then the rear cover 190 shown in FIG. 1 is fixed on the back surface side of the substrate covers 150 to 180 by screwing, for example. Moreover, as shown in FIG. 8, although the substrate covers 150 and 160 are slid to generate a clearance corresponding to the slid amount at the places at which the substrate covers 150 and 160 are contacted with the upper and lower substrate covers 170 and 180, the rear cover 190 is mounted to conceal the clearance.

As discussed above, the front cover 110 is fixed on the display device 120 side, whereby the work to fix the front cover 110 on the display device 120 side can be performed very simply, and the workability of assembly work can be improved. In other words, in fixing work, it is sufficient that the screw 99 fixed into the long screw holes 153 and 163 on the substrate covers 150 and 160 that are the covers on the back surface side of the display device 120 are loosened to slide the substrate covers 150 and 160, and then the screws 99 are again fastened, which allows very simple fixing work.

In addition, the structure is configured in which the projecting parts 114a of the fittings 114 facing the end surface of the display device 120 are fit into the slits 154 and 164 of the substrate covers 150 and 160 that are the covers on the back surface side covering the end surface of the display device 120 for fixing. Thus, the fixing mechanism to fix the front cover 110 is formed to have a slight thickness in the side surface direction of the display device 120, the thickness of the entire display apparatus 100 can be made very thin, and an excellent cabinet form can be configured that makes use of the slim form of the display device 120.

Moreover, in the embodiment discussed above, the configuration is formed in which the fitting shaving a projecting part are provided on the front cover side and the slits of the recessed parts to be fit into the projecting parts are provided on the substrate covers that are the covers on the back surface side. However, such a configuration may be possible in which projecting parts are provided on the substrate cover side and recessed parts to be fit into the projecting parts are provided on the front cover side.

In addition, in the embodiment discussed above, the configuration is formed in which the fixing mechanism is provided in which among the four substrate covers covering the back surface of the display device 120, the left and right substrate covers 150 and 160 are fit into the left and right side plate parts of the front cover 110 for fixing. For example, the similar fixing mechanism may be provided on the upper and lower substrate covers 170 and 180 and the upper and lower side plate parts of the front cover 110. Alternatively, such a configuration may be formed in which a fitting having a projecting part is provided on the right, left, upper and lower side plate parts of the front cover 110, slits are provided on all the four substrate covers 150, 160, 170 and 180, and the four substrate covers 150 to 180 are slid to fix the front cover 110.

In addition, in the embodiment discussed above, the configuration is formed in which for the covers having the fixing mechanism on the back surface side, the substrate covers are provided that are extended from the four end surfaces of the display device 120 to cover the circuit board and the substrate covers are covered with the rear cover from there above. However, such a fixing mechanism may be configured in which the rear cover itself is divided into a plurality of parts, a part or all the divided rear covers are formed to be slidable as similar to the substrate covers described above, and the rear covers are fixed to the front cover.

In addition, in the embodiment discussed above, the case is described in which the display device is an organic EL display device, but it is without saying that various publicly known thin plate display devices before such as a plasma display and a liquid crystal display can be used as a display device.

It should be understood by those skilled in the art that various modifications, combinations, sub-combinations and alterations may occur depending on design requirements and other factors in so far as they are within the scope of the appended claims or the equivalents thereof.

What is claimed is:

1. A display apparatus comprising:
    a thin plate display device configured to have a display surface for displaying an image and another surface as a back surface;
    a front cover configured to cover an outer area and end surfaces of the display surface of the display device; and
    a back surface cover configured to be mounted so as to cover the back surface of the display device, the cover being divided into a plurality of parts,
    wherein,
    a projecting part or a recessed part is provided at a plurality of places on the front cover facing the end surfaces of the display device,
    a recessed part or a projecting part is provided that is fit into the projecting part or the recessed part facing thereto, on the back surface cover at a position facing the projecting part or the recessed part on the front cover side,
    a slide mechanism part is provided in which the back surface cover is formed to move in parallel along the back surface of the display device and the fitting is achieved by the parallel motion,
    the slide mechanism part is a mechanism in which a member holding the display device is screwed to the back surface cover into a screw hole that is provided on the back surface cover in a form extended along a direction of the parallel motion, and
    the back surface cover is moved in parallel along the form of the extended screw hole, whereby the recessed part or the projecting part on the back surface cover is fit into the projecting part or the recessed part on the front cover to fix the front cover on the display device side.

2. The display apparatus according to claim 1, further comprising:
    a circuit board connected to the display device,
    wherein the back surface cover is fixed to the back surface of the display device so as to cover the circuit board arranged on the back surface of the display device, and another cover is fixed to a back surface of the plurality of the covers on the back surface side.

3. The display apparatus according to claim 1,
    wherein the projecting part or the recessed part is provided on two sides of the front cover close to two sides of the display device in parallel with each other, and a recessed part or a projecting part is provided on the back surface cover at positions facing to the two sides of the front cover.

4. A display apparatus comprising:

a display device having a front surface on which images are displayable and an oppositely facing back surface;

front and back cover members between which the display device is held; and a plate member between the back cover member and the display device;

wherein, the back cover member includes portions of sufficient dimension to extend over a portion of the back surface of the display device, the front cover member comprises a frame which surrounds the display device, the back cover member includes at least one portion that is movable relative to an edge of the front cover frame, the at least one movable back cover portion and the edge of the front cover member frame include mating fittings and slots which are engaged by moving the at least back cover member toward said front cover member frame edge, the back cover member is immovably securable to the plate member, the at least one movable back cover member portion is securable to the plate member so as to be immobile relative thereto;

5. The display apparatus of claim 4, wherein:

the back cover member includes two movable portions which extend parallel to each other, said front cover member frame includes two edges which extend parallel to said two movable back cover member portions, and each movable back cover member portion engages a respective edge of said front cover member frame by operative engagement of the fittings and slots.

\* \* \* \* \*